(12) United States Patent
Wuu et al.

(10) Patent No.: US 8,785,947 B2
(45) Date of Patent: Jul. 22, 2014

(54) SEMICONDUCTOR SUBSTRATE FOR GROWTH OF AN EPITAXIAL SEMICONDUCTOR DEVICE

(75) Inventors: Dong-Sing Wuu, Taichung (TW); Ray-Hua Horng, Taichung (TW); Chia-Cheng Wu, Taichung (TW); Po-Rung Lin, Taichung (TW)

(73) Assignee: National Chung-Hsing University, Taichung (TW)

( * ) Notice: Subject to any disclaimer, the term of this patent is extended or adjusted under 35 U.S.C. 154(b) by 860 days.

(21) Appl. No.: 12/648,012

(22) Filed: Dec. 28, 2009

(65) Prior Publication Data

US 2010/0163839 A1   Jul. 1, 2010

(30) Foreign Application Priority Data

Dec. 30, 2008 (TW) ................ 97151449 A

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |

(52) U.S. Cl.
USPC ............. 257/79; 257/E21.09; 257/E21.132; 257/E21.601

(58) Field of Classification Search
USPC ............ 257/79, E21.09, E21.097, E21.108, 257/E21.12, E21.121, E21.132, E21.601, 257/E23.016, E21.32, E21.416; 438/341, 438/481; 977/701, 723
See application file for complete search history.

(56) References Cited

U.S. PATENT DOCUMENTS

| | | | |
|---|---|---|---|
| 5,073,230 A | 12/1991 | Maracas et al. | |
| 2008/0038857 A1 | 2/2008 | Kim et al. | |
| 2008/0149941 A1* | 6/2008 | Li et al. | 257/76 |
| 2011/0168969 A1* | 7/2011 | Wang et al. | 257/10 |

FOREIGN PATENT DOCUMENTS

| | | |
|---|---|---|
| TW | 200837979 | 9/2008 |
| WO | WO 2008087452 A1 * | 7/2008 |
| WO | WO 2008096168 A1 * | 8/2008 |

* cited by examiner

*Primary Examiner* — Benjamin Sandvik
*Assistant Examiner* — Leslie Pilar Cruz
(74) *Attorney, Agent, or Firm* — Dickstein Shapiro LLP

(57) ABSTRACT

A semiconductor substrate includes: a base layer; a sacrificial layer that is formed on a base layer and that includes a plurality of spaced apart sacrificial film regions and a plurality of first passages each of which is defined between two adjacent ones of the sacrificial film regions. Each sacrificial film region has a plurality of nanostructures and a plurality of second passages defined among the nanostructures. The second passages communicate spatially with the first passages and have a width less than that of the first passages. An epitaxial layer is disposed on the sacrificial layer.

9 Claims, 17 Drawing Sheets

US 8,785,947 B2

SEMICONDUCTOR SUBSTRATE FOR GROWTH OF AN EPITAXIAL SEMICONDUCTOR DEVICE

CROSS-REFERENCE TO RELATED APPLICATION

This application claims priority of Taiwanese application No. 097151449, filed on Dec. 30, 2008.

BACKGROUND OF THE INVENTION

1. Field of the Invention

This invention relates to a semiconductor substrate, more particularly to a semiconductor substrate for growth of an epitaxial semiconductor device.

2. Description of the Related Art

In optoelectric devices, a substrate suitable for growth of epitaxial layers thereon usually has a preferable lattice mismatch with the epitaxial layers, but has disadvantages, such as poor heat conductivity. Conversely, a substrate having a relatively high heat conductivity usually has a problem of lattice mismatching, which results in production of a number of threading dislocations. An existing method of making a semiconductor substrate is generally carried out by removing the substrate (sapphire) from the epitaxial layers and by attaching a heat-dissipating layer having a high heat conductivity to the epitaxial layers so as to maintain quality of the epitaxial layers and so as to enhance heat conduction.

U.S. Patent Application Publication No. 2008/0038857A1 discloses a method of making a gallium nitride-based semiconductor light-emitting device. The method includes steps of forming a sacrificial layer interposed between a substrate and a semiconductor epitaxial structure, and wet etching the sacrificial layer so as to remove the substrate from the semiconductor epitaxial structure. However, such removal has a disadvantage of poor etching efficiency due to side etching.

U.S. Pat. No. 5,073,230 discloses a method of making a semiconductor device. The method includes forming a plurality of etching holes that extend through a sacrificial layer and directing an etchant through the etching holes to eliminate the sacrificial layer. Formation of the etching holes increases an etching area and an etching rate. However, since the sacrificial layer itself is a dense film structure, the etching efficiency is still poor.

SUMMARY OF THE INVENTION

Therefore, an object of the present invention is to provide a semiconductor substrate that can overcome the aforesaid drawbacks associated with the prior art.

According to the present invention, a semiconductor substrate for growth of an epitaxial semiconductor device thereon comprises: a base layer; and a sacrificial layer formed on the base layer, and including a plurality of spaced apart sacrificial film regions and a plurality of first passages each of which is defined between two adjacent ones of the sacrificial film regions. Each of the sacrificial film regions has a plurality of nanostructures and a plurality of second passages defined among the nanostructures. The second passages are communicated spatially with the first passages and have a width less than that of the first passages. An epitaxial layer is disposed on the sacrificial layer.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
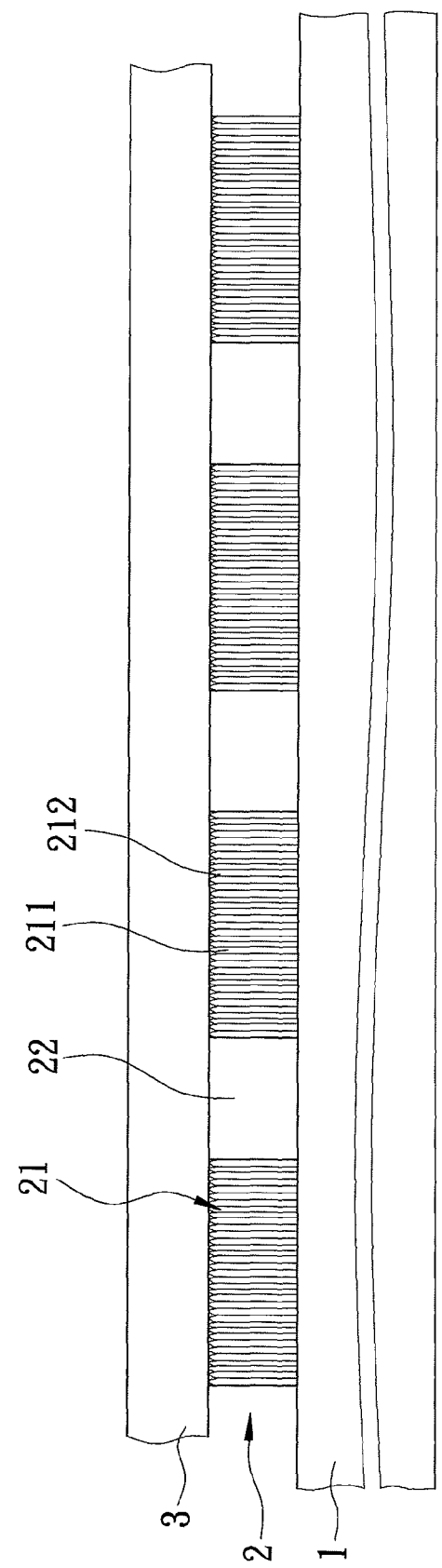
FIG. 1 is a fragmentary schematic view of the first preferred embodiment of a semiconductor substrate according to this invention.

Before the present invention is described in greater detail with reference to the accompanying preferred embodiments, it should be noted herein that like elements are denoted by the same reference numerals throughout the disclosure.

Referring to FIG. 1, a semiconductor substrate of the first preferred embodiment according to this invention includes a single crystal sapphire base layer 1 having a hexagonal crystal structure, a sacrificial layer 2 formed on the base layer 1 and having a hexagonal crystal structure, and an epitaxial layer 3 formed on the sacrificial layer 2.

Preferably, a selective etching ratio of the sacrificial layer 2 to the epitaxial layer 3 is greater than 5, more preferably, greater than 50.

In this embodiment, the sacrificial layer 2 is made of zinc oxide, the epitaxial layer 3 is made of gallium nitride (GaN), and an etching agent of hydrofluoric acid (HF) is used to etch the sacrificial layer 2 so that the epitaxial layer 3 is separated from the base layer 1. An etching rate at room temperature for the sacrificial layer 2 is about 15 µm/min and for the epitaxial layer 3 is lower than $10^{-5}$ µm/min. Alternatively, when the etching agent is hydrochloric acid (HCl), the etching rate for the sacrificial layer 2 is about 55 µm/min and for the epitaxial layer 3 is below $10^{-5}$ µm/min.

The sacrificial layer 2 is patterned and includes a plurality of spaced-apart sacrificial film regions 21 and a plurality of first passages 22. Each of the first passages 22 is defined between two adjacent ones of the sacrificial film regions 21 and has a width ranging from 1 µm to 10 µm. When the width of the first passages 22 is less than 1 µm, a flow rate of the etching agent is reduced, thereby adversely affecting the etching rate. On the contrary, when the width of the first passages 22 is greater than 10 µm, the epitaxial layer 3 cannot efficiently form a film.

Preferably, the first passages 21 have a height ranging from 0.5 µm to 5 µm. When the height is less than 0.5 µm, the first passages 21 may be filled with the epitaxial layer 3 during growth thereof and are therefore blocked such that the subsequent etching treatment cannot be efficiently carried out by passing the etching agent through the first passages 21 to remove the sacrificial layer 2 from the epitaxial layer 3. On the contrary, when the height is greater than 5 µm, the manufacturing cost is increased.

Figure 2A:
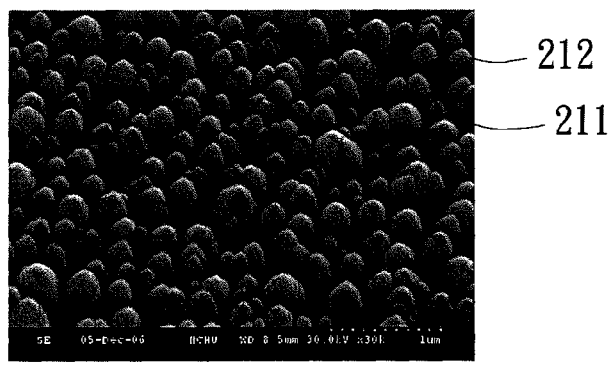
FIGS. 2a to 2c are electron microscopic views showing a plurality of nanostructures.
Figure 2B:
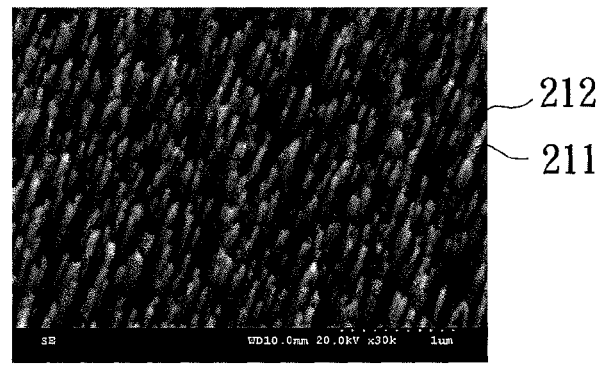
Figure 2C:

Referring to FIGS. 2a to 2c in combination with FIG. 1, each of the sacrificial film regions 21 includes a plurality of nanostructures 211 and a plurality of second passages 212 formed among the nanostructures 211. Each of the nanostructures 211 may be selected from the group consisting of nano-columns, nano-rods, nano-needles, nanotubes, and combinations thereof. In this embodiment, the nanostructures 211 are made of zinc oxide.

Preferably, each of the nanostructures 211 has a diameter ranging from 5 nm to 500 nm. If the diameter is less than 5 nm, the epitaxial layer 3 formed thereon can not be efficiently attached to the sacrificial layer 2. On the contrary, if the diameter is greater than 500 nm, the width and the number of the second passages 212 in each sacrificial film region 21 can be reduced, which adversely affects the permeation of the etching agent therethrough.

Preferably, the second passages 212 have an average width less than that of the first passages 22 and are spatially communicated with each other and with the first passages 22, thereby benefiting the permeation of the etching agent. The second passages 212 have an average width ranging from 5 nm to 500 nm. When the average width is less than 5 nm, the etching rate is adversely affected. On the contrary, when the average width is greater than 500 nm, the epitaxial layer 3 is not efficiently formed as a film.

Figure 3:
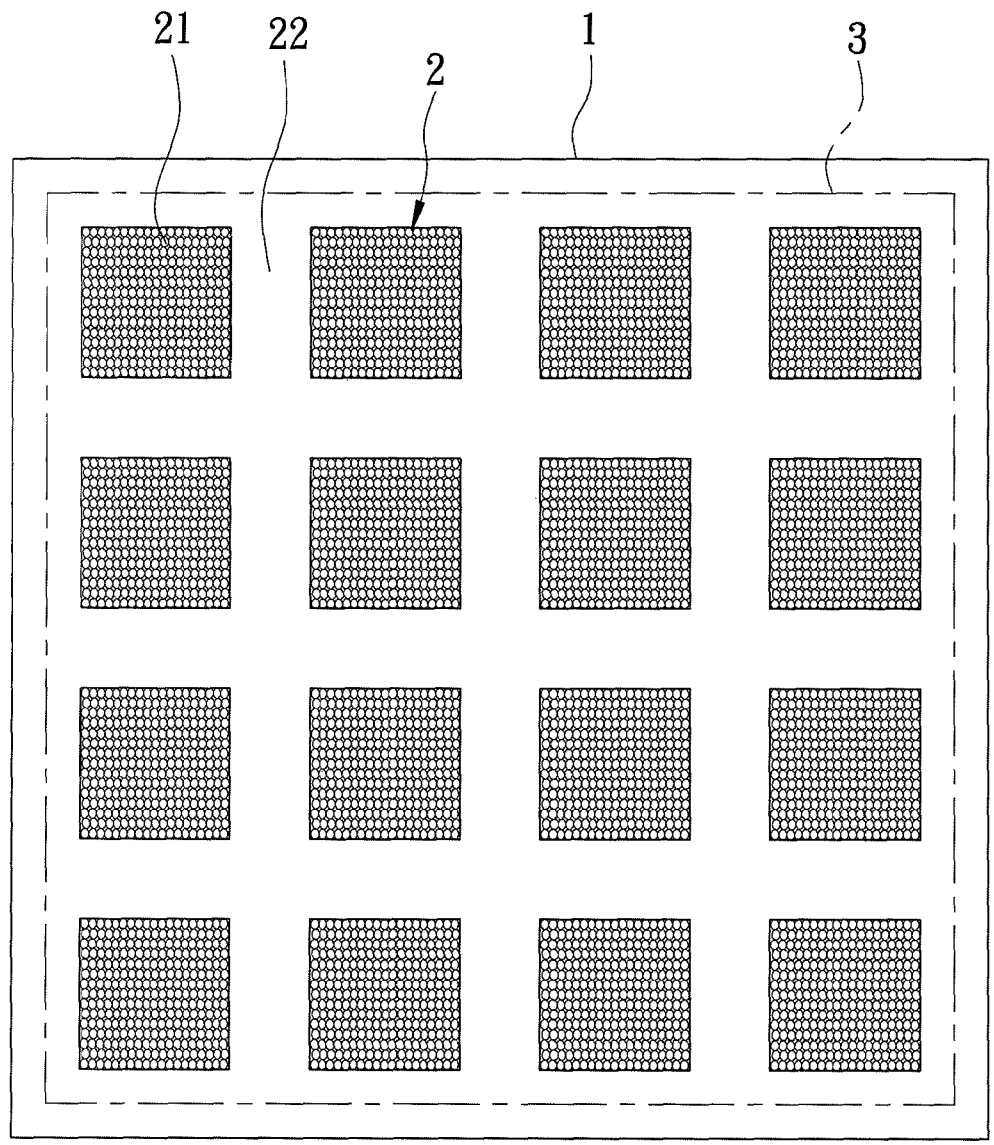
FIG. 3 is a top view of the first preferred embodiment, illustrating a plurality of sacrificial film regions arranged in a matrix array.

Referring to FIG. 3, the first passages 22 are interconnected and fluidly communicated with each other. The nanostructures 211 are composed of nano-columns made of zinc oxide.

Figure 4:
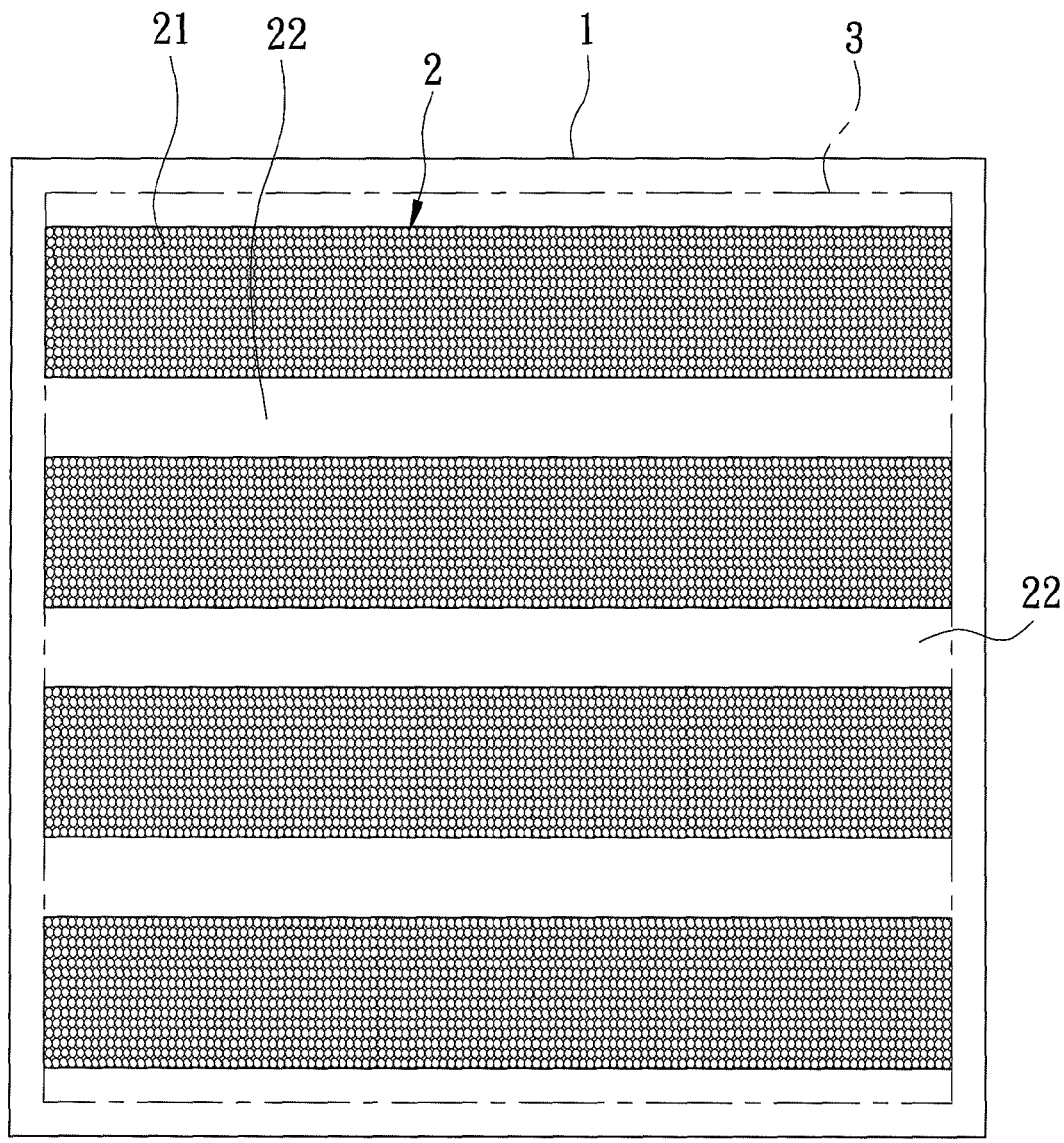
FIG. 4 is the same view as FIG. 3, but illustrating the sacrificial film regions arranged in parallel.

Referring to FIG. 4, the sacrificial film regions 21 are arranged in parallel so that the first passages 22 are parallel. The first passages 22 are fluidly communicated with each other via the second passages 212.

Figure 5:
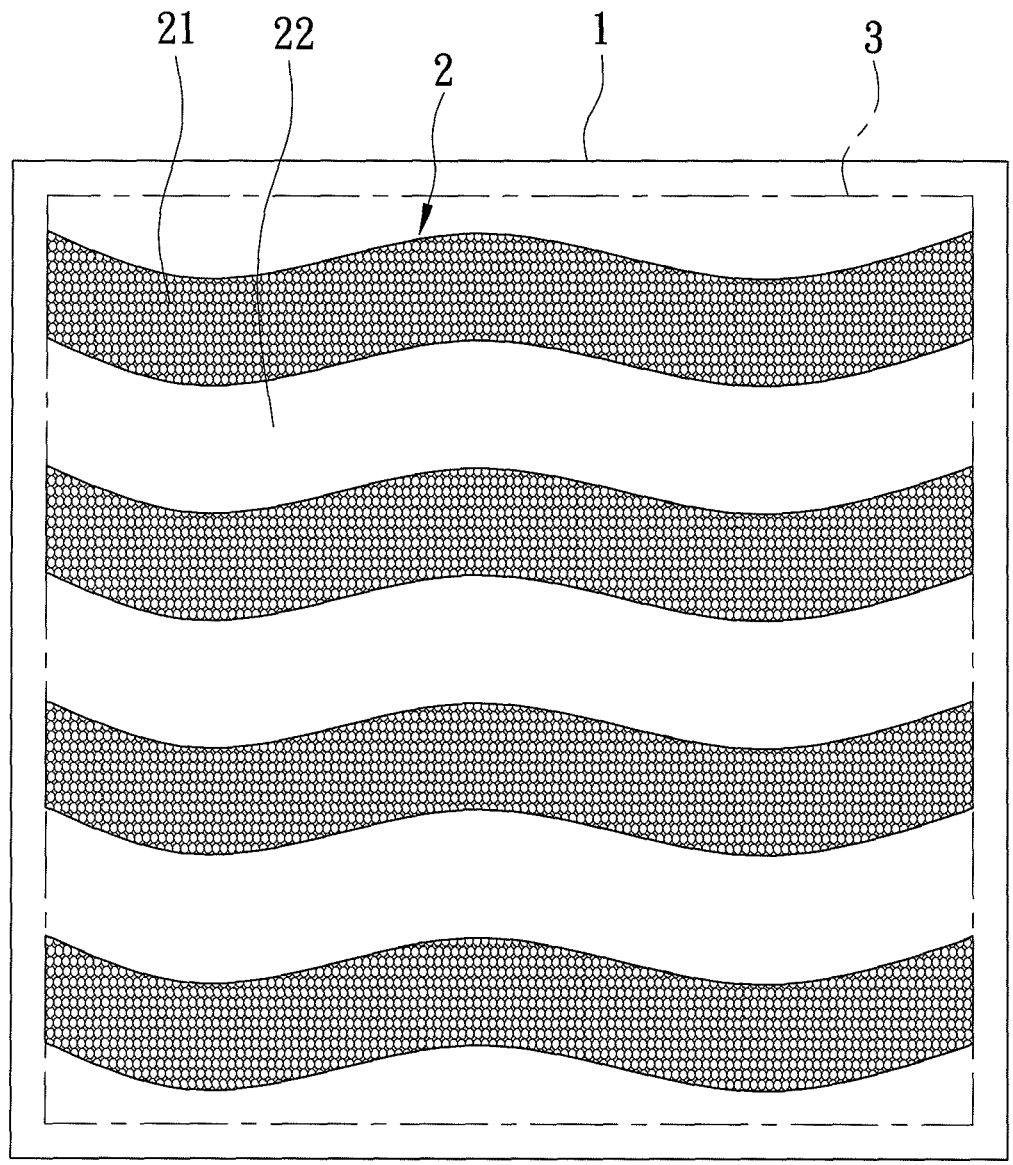
FIG. 5 is the same view as FIG. 3, but illustrating the sacrificial film regions in the form of curves.

Referring to FIG. 5, the first passages 22 may be in the form of curves, instead of having the shape of straight lines. Alternatively, the first passages 22 may be arranged in a serrated fashion, helical fashion or dendritic fashion (not shown).

Figure 6:
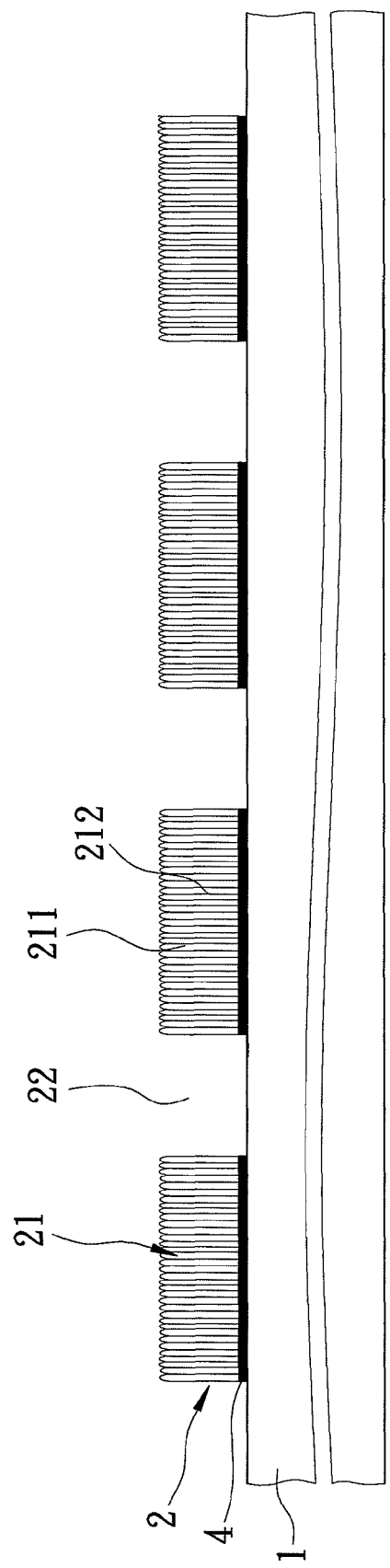
FIGS. 6 and 7 are fragmentary schematic views to illustrate consecutive steps of a method of making the semiconductor substrate according to this invention.
Figure 7:
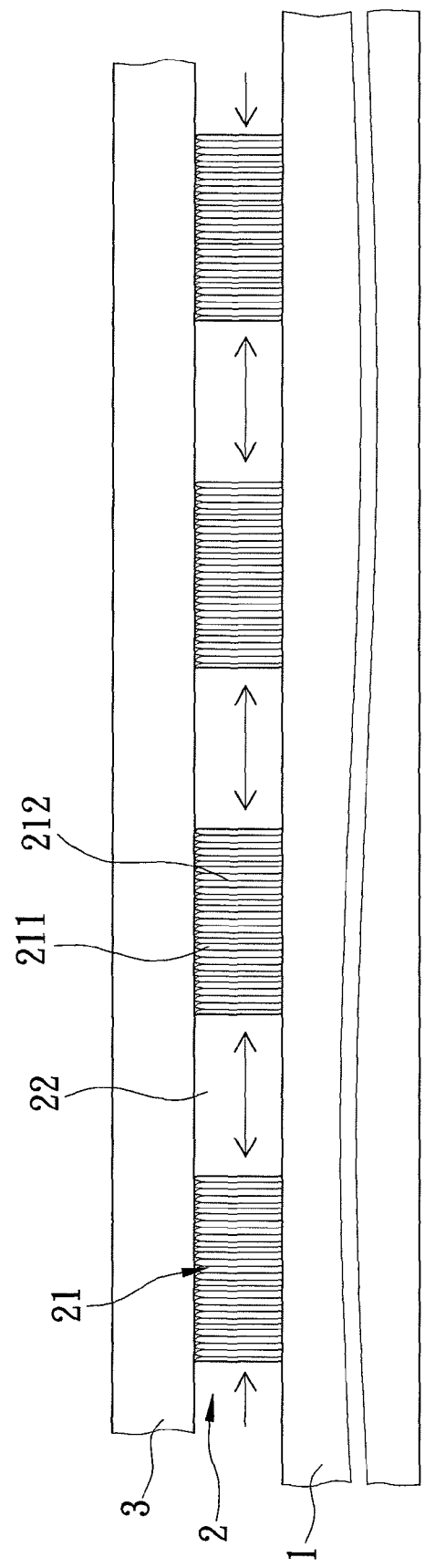

FIGS. 6 and 7 illustrate the consecutive steps of a method of making the semiconductor substrate according to the first preferred embodiment.

Referring to FIG. 6, a patterned metal film 4 having a thickness ranging from 1 nm to 30 nm is formed on the base layer 1 so as to define positions of the sacrificial film regions 21 and the width of the first passages 22. Subsequently, the nanostructures 211 of the sacrificial layer 2 are grown on the base layer 1 according to the pattern of the patterned metal film 4, thereby resulting in the sacrificial film regions 21 and the first passages 22. The sacrificial layer 2 is formed by metal organic chemical vapor deposition techniques (MOCVD).

Figure 8A:
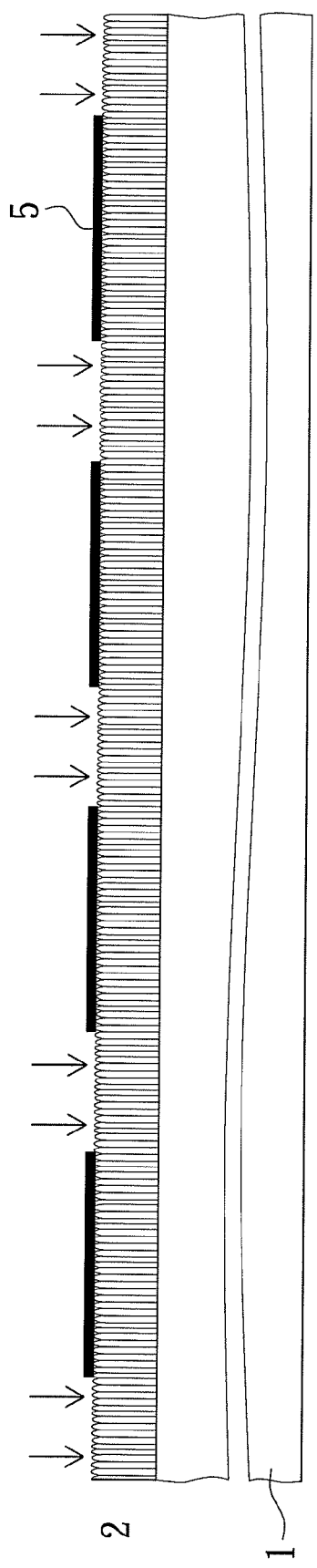
FIGS. 8a and 8b are fragmentary schematic views to illustrate formation of a plurality of first passages using a patterned mask.
Figure 8B:
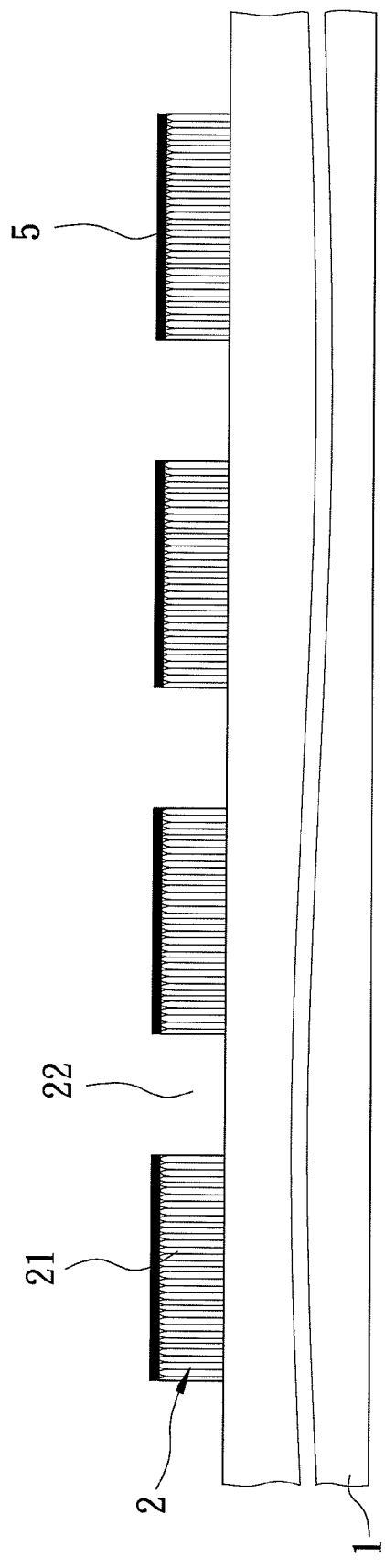
Figure 9:
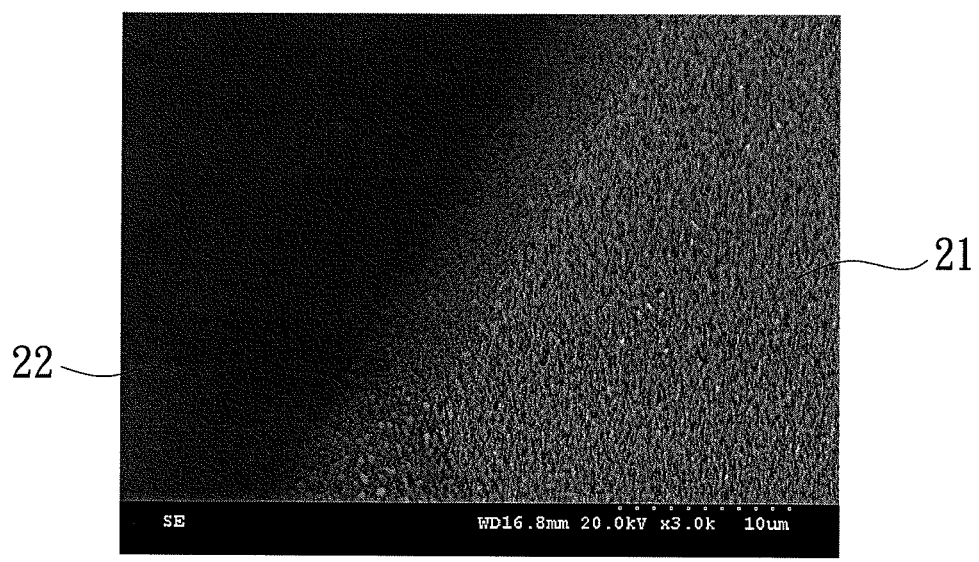
FIG. 9 is an electron microscopic view showing a sacrificial layer subjected to a laser treatment.

Referring to FIGS. 8a and 8b, the sacrificial layer 2 is deposited directly on the base layer 1 without using the patterned metal film 4. In this case, the sacrificial layer 2 covers entirely the base layer 1. By covering portions of the sacrificial layer 2 with a patterned mask 5, uncovered portions of the sacrificial layer 2 are removed by etching, thereby forming the first passages 22. Alternatively, removal of the uncovered portions of the sacrificial layer 2 can be carried out using laser as shown in FIG. 9.

Referring to FIG. 7, the epitaxial layer 3 is formed on the sacrificial layer 2 by metal organic chemical vapor deposition techniques (MOCVD). By virtue of the first and second passages 22, 212, and the nanostructures 211, the epitaxial layer 3 grown on the sacrificial layer 2 using epitaxial lateral overgrowth has a low dislocation density.

After growth of the epitaxial layer 3, the sacrificial layer 2 is subjected to an etching treatment using wet etching, thereby separating the base layer 1 from the epitaxial layer 3. The etching treatment is carried out by passing an acid etching agent through the first and second passages 22, 212, which provide an increased surface area for the etching reaction and increased permeability for the etching agent.

Preferably, the acid etching agent is selected from the group consisting of hydrofluoric acid, sulfuric acid, hydrochloric acid, phosphoric acid, a buffered oxide etchant (BOE), and diluted or mixed solutions thereof. In this embodiment, the wet etching includes steam etching.

Figure 10:
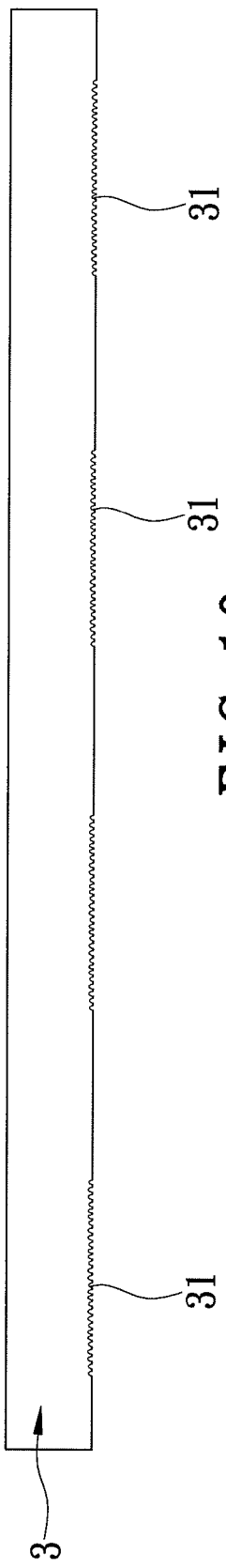
FIG. 10 is a fragmentary schematic view of an epitaxial layer of the first preferred embodiment separated from a base layer after an etching treatment.

It is worth mentioning that, after removal of the sacrificial layer 2, the nanostructures 211 leave a plurality of rough surface portions 31 on the epitaxial layer 3 as shown in FIG. 10. The rough surface portions 31 are beneficial for emission of light when the epitaxial layer 3 is used to form a light-emitting device. The base layer 1 separated from the epitaxial layer 3 can be reused.

Figure 11:
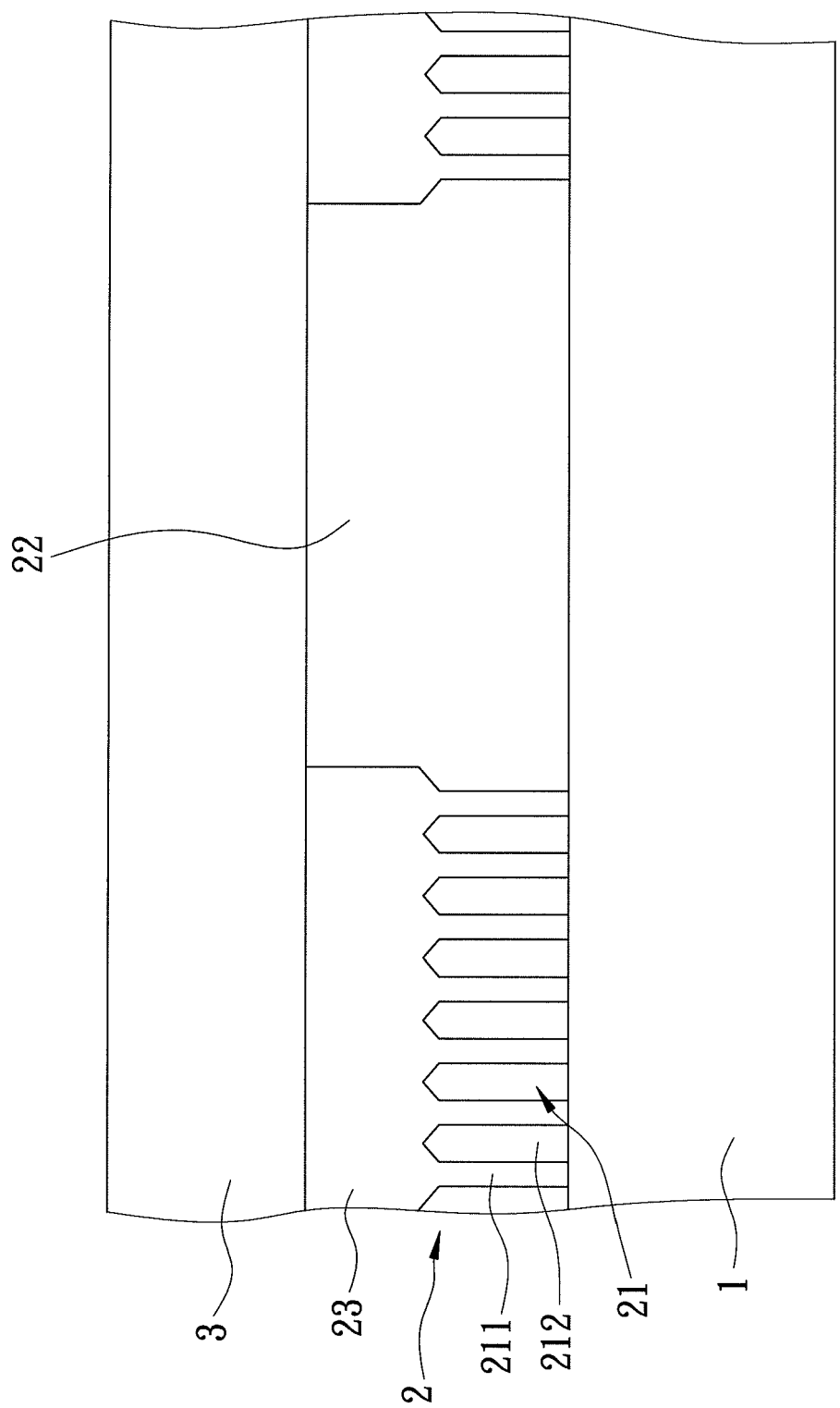
FIG. 11 is a fragmentary schematic view of the second preferred embodiment of the semiconductor substrate according to this invention.

Referring to FIG. 11, the second preferred embodiment of the present invention differs from the first preferred embodiment in that each of the sacrificial film regions 21 further has flat dense film portions 23 connected to the nanostructures 211 in proximity to the epitaxial layer 3. Formation of the flat dense film portions 23 can improve epitaxial quality of the epitaxial layer 3.

Figure 12:
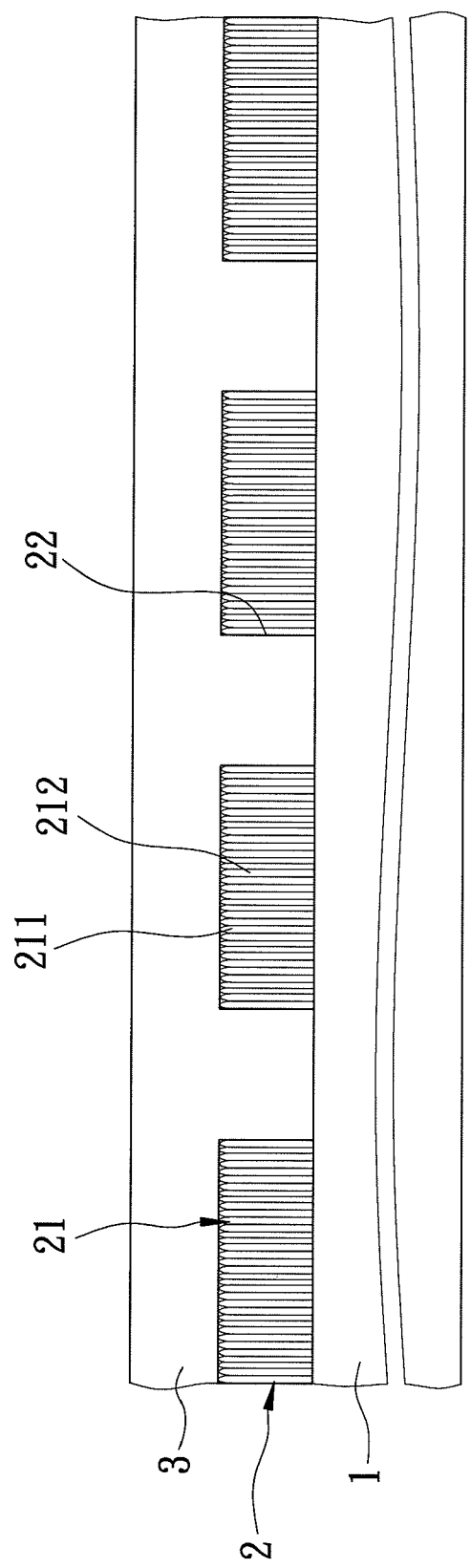
FIG. 12 is a fragmentary schematic view of the third preferred embodiment of the semiconductor substrate according to this invention.
Figure 16:
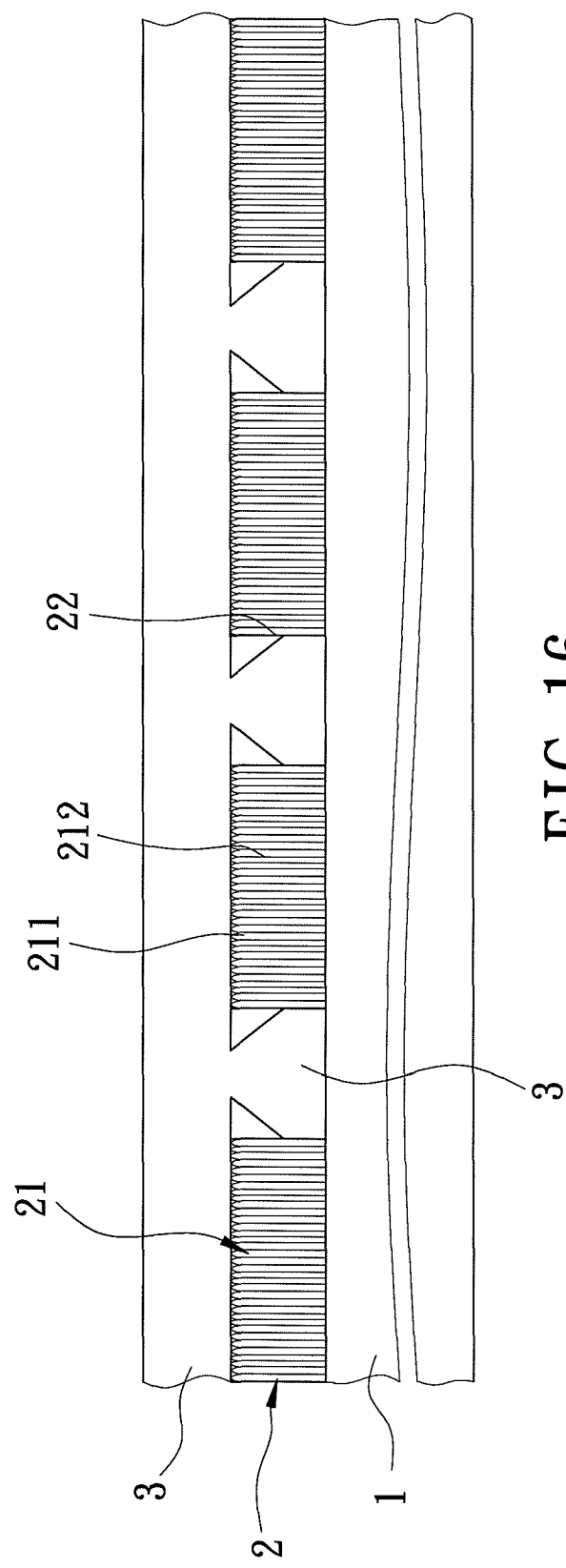
FIG. 16 is a fragmentary schematic view of the fourth preferred embodiment of the semiconductor substrate according to this invention.
Figure 17:
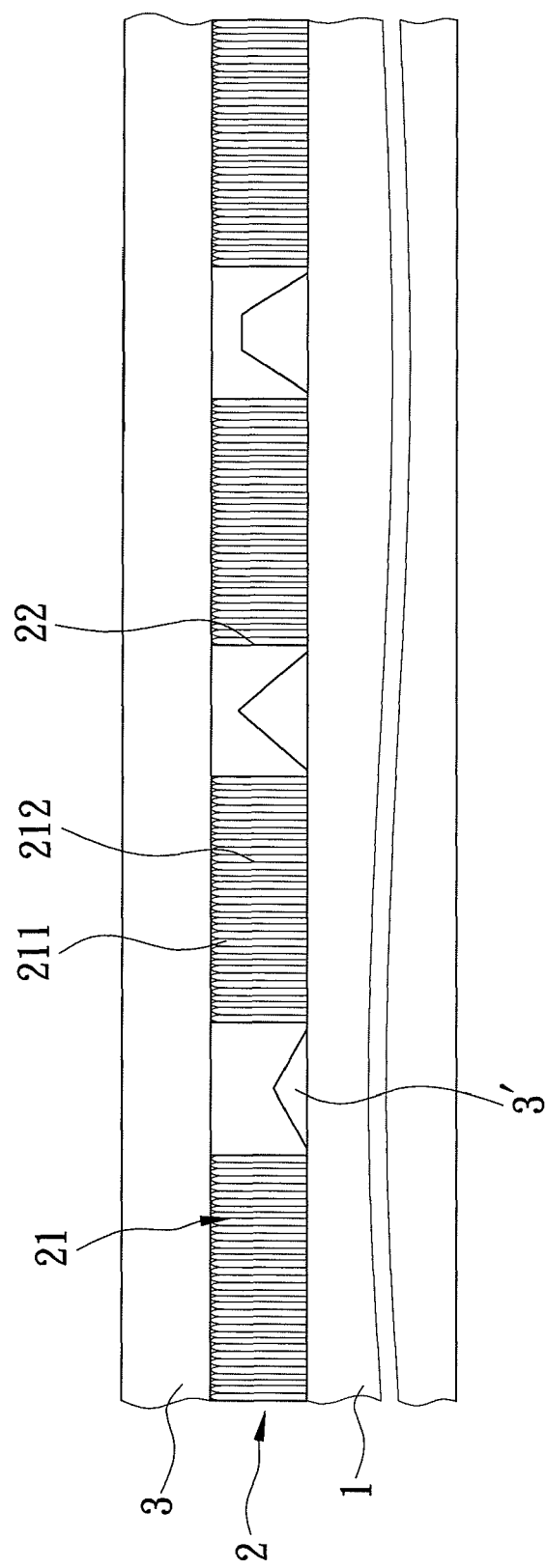
FIG. 17 is a fragmentary schematic view of the fifth preferred embodiment of the semiconductor substrate according to this invention.

Referring to FIGS. 12, 16 and 17, the third, fourth, and fifth preferred embodiments of the present invention differ from the first preferred embodiment in that the epitaxial layer 3 fills the first passages 22.

In these embodiments, the first passages 22 have a width ranging from 1 µm to 50 µm, and a height ranging from 0.5 µm to 3 µm. When the width of the first passages 22 is greater than 50 µm, the epitaxial layer 3 does not efficiently form a film. When the height of the first passages 22 is smaller than 0.5 µm, the first passages 22 are quickly and completely filled with the epitaxial layer 3 so that epitaxial lateral overgrowth which can reduce dislocation density can hardly take place. In addition, when the width of the first passages 22 is smaller than 1 µm, the lateral growth of the epitaxial layer 3 results in a quick merger so that reduction of the dislocation density is attenuated. When the height of the first passages 22 is greater than 3 µm or a ratio of the height to the width of the first passages 22 is greater than 3 µm, the epitaxial layer 3 does not easily fill the first passages 22 and the manufacturing cost is increased.

Referring to FIG. 17, the epitaxial film 3' filled partially in each of the first passages 22 is not connected to the epitaxial layer 3 in the fifth embodiment. The sacrificial layer 2 can be removed most easily in the fifth embodiment compared to the third and fourth embodiments of FIGS. 12 and 16.

Figure 13:
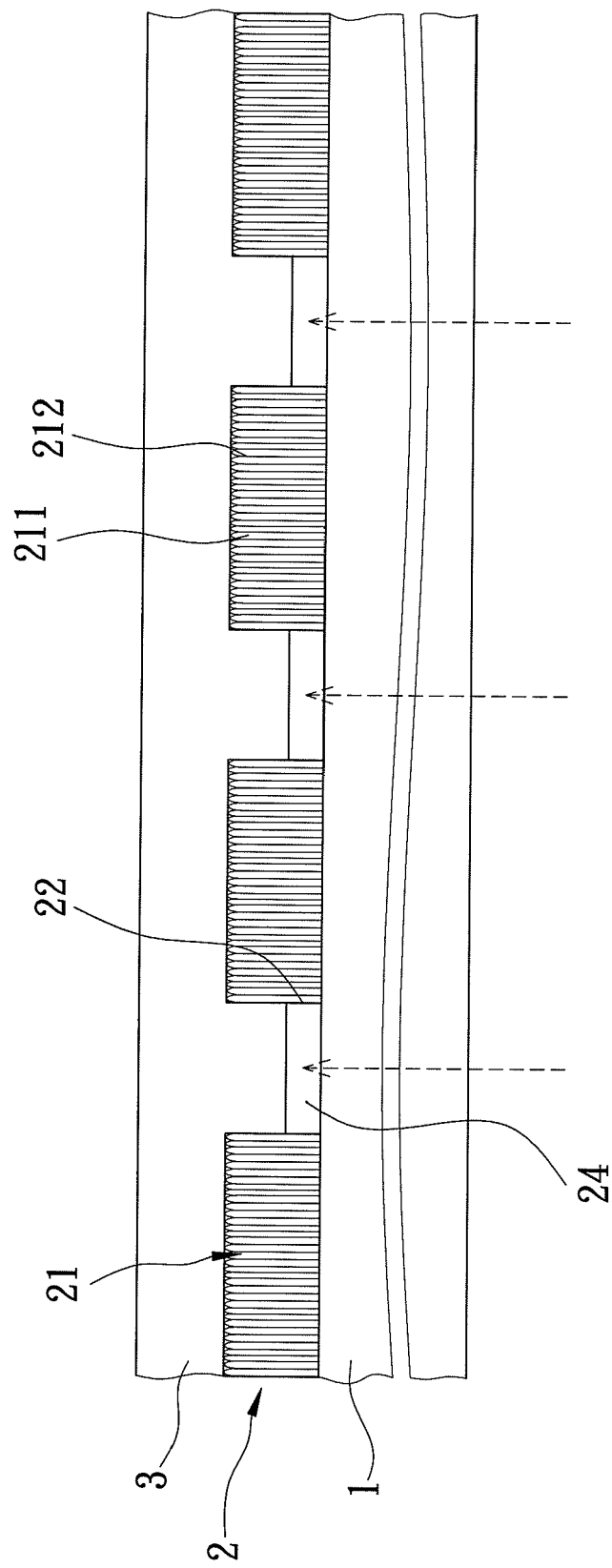
FIG. 13 is a fragmentary schematic view of the third preferred embodiment after being subjected to a laser treatment to form a gap.
Figure 14:
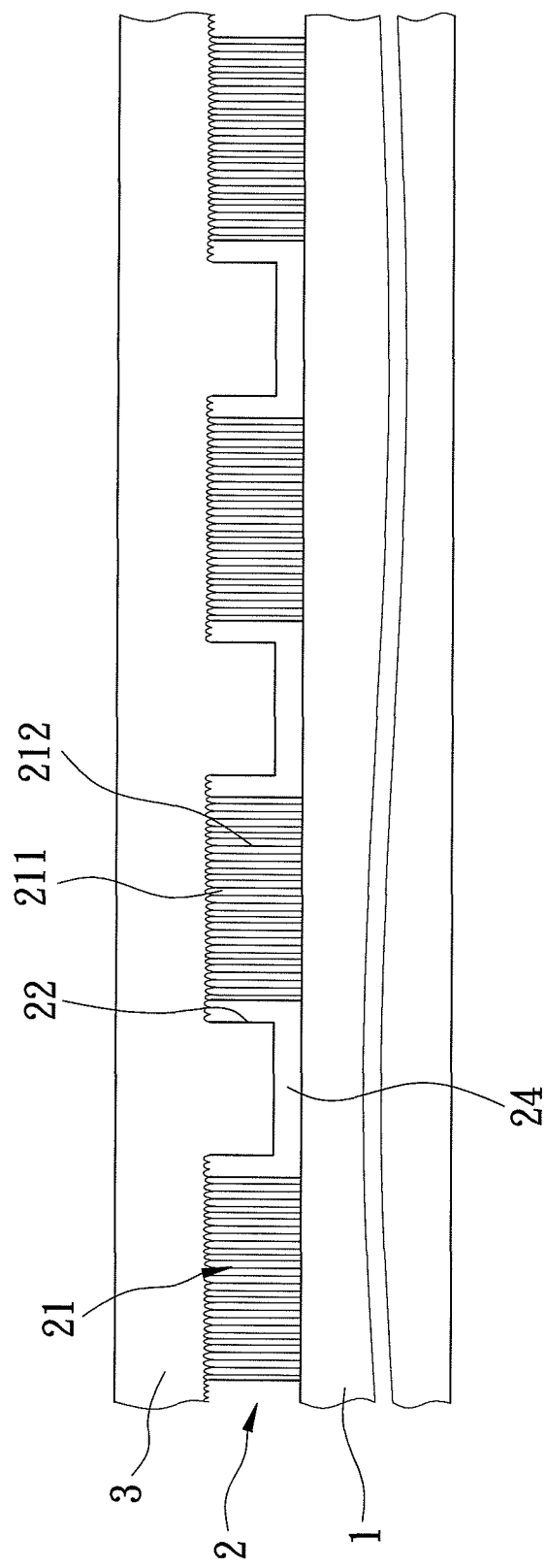
FIG. 14 is a fragmentary schematic view of the third preferred embodiment, which is subjected to an etching treatment after formation of the gap.
Figure 15:
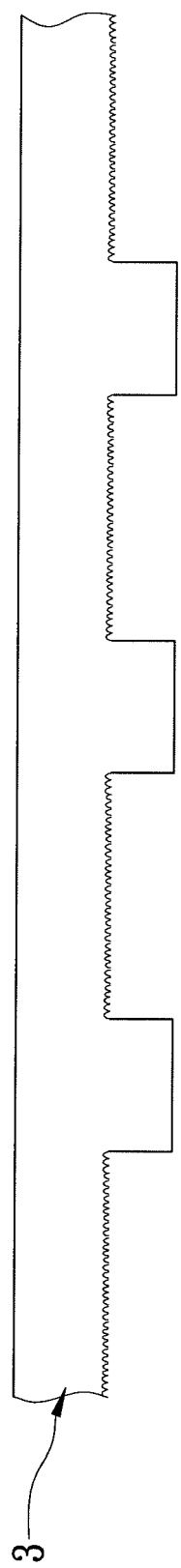
FIG. 15 is a fragmentary schematic view of the epitaxial layer of the third preferred embodiment after the etching treatment.

Referring to FIGS. 12 to 14, the epitaxial layer 3 completely fills the first passages 22, and a laser with a short wavelength is subsequently applied to the epitaxial layer 3 proximate to the base layer 1 within the first passages 22. Therefore, portions of the epitaxial layer 3 are vaporized and generate nitrogen, thereby forming gaps 24 in the first passages 22. Thereafter, the sacrificial layer 2 is subjected to the etching treatment with the etching agent through the gaps 24. After removal of the sacrificial layer 2, the epitaxial layer 3 has a configuration as shown in FIG. 15.

Preferably, a krypton-fluoride (KrF) excimer laser having a wavelength of 248 nm and a power of 500-1500 mJ/cm$^2$ is used. Other usable lasers are argon-fluoride (ArF) laser having a wavelength of 193 nm, xenon-chloride (XeCl) laser having a wavelength of 308 nm, xenon-fluoride (XeF) laser having a wavelength of 351 nm, krypton-chloride (KrCl) laser having a wavelength of 222 nm, xenon-bromine (XeBr) laser having a wavelength of 282 nm, and a solid-state laser, such as triple frequency Nd:YAG having a wavelength of 355 nm, or quadruple frequency Nd:YAG having a wavelength of 266 nm.

EXAMPLES

Example 1

The nanostructures 211 are grown as nano-columns from zinc oxide using a chemical vapor deposition (CVD) process. The parameters of the process are: 10 torr; 450° C.; 60 min; 80 sccm diethyzinc (DEZn); and 1000 sccm $O_2$.

Example 2

The nanostructures 211 are formed as nano-needles through a two-step process. In the first step, the parameters are: 10 torr; 450° C.; 5 min; 10 sccm diethyzinc (DEZn); and 200 sccm $O_2$. In the second step, the parameters are: 650° C.; 60 min; 60 sccm diethyzinc (DEZn); and 600 sccm $O_2$.

Example 3

The nanostructures 211 are formed as nanotubes employing a three-step process. In the first step, the parameters are: 10 torr; 450° C.; 15 min; 5 sccm diethyzinc (DEZn); and 200 sccm $O_2$. In the second step, the parameters are: 650° C.; 30 min; 30 sccm diethyzinc (DEZn); and 600 sccm $O_2$. In the third step, the parameters are: 450° C.; 90 min; 30 sccm diethyzinc (DEZn); and 600 sccm $O_2$.

Example 4

The epitaxial layer 3 is made from gallium nitride by chemical vapor deposition. The parameters are: 1040° C.; 300 slm $NH_3$; 10 slm $N_2$; and 65 sccm trimethylgallium (TMGa).

Example 5

A semiconductor substrate having a 2 inch size is formed. Each of the sacrificial film regions 21 has an area of 1 mm×1 mm, and a thickness of 1 μm. The sacrificial layer 2 is etched using hydrochloric acid for about 150 min. The etching rate is 3.3 μm/min.

Example 6

The experiment in this example is substantially similar to that in Example 5 except that the area of each of the sacrificial film regions 21 is reduced to 0.3 mm×0.3 mm, the etching time is about 25 min and the etching rate is 6 μm/min.

From examples 5 and 6, it can be understood that when the area of the sacrificial film regions 21 is reduced, the number of the first passages 22 increases, and the etching rate is efficiently increased.

With the invention thus explained, it is apparent that various modifications and variations can be made without departing from the spirit of the present invention. It is therefore intended that the invention be limited only as recited in the appended claims.

What is claimed is:

1. A semiconductor substrate for growth of an epitaxial semiconductor device thereon, said semiconductor substrate comprising:
   a base layer;
   a sacrificial layer formed on said base layer, and including a plurality of spaced apart sacrificial film regions and a plurality of first passages each of which is defined between two adjacent ones of said sacrificial film regions, each of said sacrificial film regions having a plurality of nanostructures and a plurality of second passages defined among said nanostructures, said second passages being communicated spatially with said first passages and having a width less than that of said first passages; and
   an epitaxial layer disposed on said sacrificial layer,
   wherein a selective etching ratio of said sacrificial layer to said epitaxial layer is greater than 5; and
   wherein said epitaxial layer does not fill said first passages.

2. The semiconductor substrate of claim 1, wherein said first passages are in fluid communication with each other.

3. The semiconductor substrate of claim 1, wherein each of said nanostructures is selected from the group consisting of nano-columns, nano-rods, nano-needles, nanotubes, and combinations thereof.

4. The semiconductor substrate of claim 1, wherein each of said nanostructures has a diameter ranging from 5 nm to 500 nm.

5. The semiconductor substrate of claim 1, wherein each of said second passages has a width ranging from 5 nm to 500 nm.

6. The semiconductor substrate of claim 1, wherein each of said sacrificial film regions has a flat dense film portion in proximity to said epitaxial layer.

7. The semiconductor substrate of claim 1, wherein each of said first passages has a width ranging from 1 μm to 10 μm.

8. The semiconductor substrate of claim 1, wherein each of said first passages has a height ranging from 0.5 μm to 5 μm.

9. The semiconductor substrate of claim 1, wherein said epitaxial layer is made from gallium nitride.

* * * * *